United States Patent
Kubota et al.

(10) Patent No.: US 7,163,871 B2
(45) Date of Patent: Jan. 16, 2007

(54) MANUFACTURING METHOD OF SEMICONDUCTOR DEVICE AND OXIDIZATION METHOD OF SEMICONDUCTOR SUBSTRATE

(75) Inventors: Taishi Kubota, Tokyo (JP); Yoshihiro Kitamura, Tokyo (JP); Takuo Ohashi, Tokyo (JP); Susumu Sakurai, Tokyo (JP); Takayuki Kanda, Tokyo (JP); Shinichi Horibe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/763,244

(22) Filed: Jan. 26, 2004

(65) Prior Publication Data

US 2004/0214404 A1 Oct. 28, 2004

(30) Foreign Application Priority Data

Jan. 27, 2003 (JP) .............................. 2003-016968

(51) Int. Cl.
*H01L 21/76* (2006.01)
(52) U.S. Cl. .................. 438/425; 438/426; 438/435
(58) Field of Classification Search ............... 438/425, 438/426, 435
See application file for complete search history.

(56) References Cited

U.S. PATENT DOCUMENTS

| | | | | |
|---|---|---|---|---|
| 5,719,085 A | * | 2/1998 | Moon et al. ................ | 438/424 |
| 5,891,809 A | * | 4/1999 | Chau et al. ................. | 438/770 |
| 6,150,234 A | * | 11/2000 | Olsen ......................... | 438/424 |
| 6,368,931 B1 | * | 4/2002 | Kuhn et al. ................. | 438/359 |
| 6,566,224 B1 | * | 5/2003 | Chang et al. ............... | 438/424 |
| 6,670,242 B1 | * | 12/2003 | Brady et al. ................ | 438/261 |

FOREIGN PATENT DOCUMENTS

| | | |
|---|---|---|
| CN | 1293452 A | 5/2001 |
| CN | 1392604 A | 1/2003 |
| JP | 63-316440 | 12/1988 |
| JP | 6-267938 | 9/1994 |
| JP | 11-274288 | 10/1999 |
| JP | 2000-269499 | 9/2000 |

* cited by examiner

*Primary Examiner*—Trung Dang
(74) *Attorney, Agent, or Firm*—Young & Thompson (57) ABSTRACT

A manufacturing method of a semiconductor device having a trench is provided to form, at a corner portion of the trench, an oxide film which is greater in thickness and smaller in stress than at other portions. When the trench formed in the semiconductor substrate is oxidized, it is oxidized in an oxygen environment containing dichloroethylene at a predetermined weight percent to allow the formation of an oxide film having a greater thickness at the corner portion of the trench than thickness at other portions, whereby the semiconductor device improving dielectric breakdown characteristics can be obtained.

4 Claims, 7 Drawing Sheets

MANUFACTURING METHOD OF SEMICONDUCTOR DEVICE AND OXIDIZATION METHOD OF SEMICONDUCTOR SUBSTRATE

BACKGROUND OF THE INVENTION

1. Field of the Invention

The present invention relates to a manufacturing method of a semiconductor device comprising an STI (Shallow Trench Isolation) edge, and more particularly, to a method of oxidizing a trench formed in a semiconductor substrate.

2. Description of the Related Art

Heretofore, in a semiconductor device such as a DRAM, an STI technique has been used to form, on one surface of a silicon substrate, element regions surrounded by a trench filled with an insulator, and MOS transistors having source and drain regions are formed in the element regions, and then gate electrodes, capacitors and wire layers are formed in these element regions. When such a semiconductor device is manufactured, an STI region is formed by filling the insulator into the trench formed in the silicon substrate before an insulating film remaining on the silicon substrate in the vicinity of the trench is removed, and a gate oxide film and the gate electrode are formed on the semiconductor substrate in the vicinity of the trench. Such a semiconductor device has a configuration having a pattern in which the gate electrode extends from the region adjacent onto the oxide film filled into the trench.

The semiconductor device described above has a configuration in which an edge of the STI region is adjacent to the gate insulating film and the gate electrode. If TZDB (Time Zero Dielectric Breakdown) characteristics of the semiconductor device with such a configuration is evaluated, it is found that the dielectric breakdown is often caused in the gate insulating film having a thickness of 6 nm by a voltage of 8 V or less (i.e., an electric field intensity of 13.3 MV/cm or less). On the other hand, it is presumed that the dielectric breakdown is caused by the STI edge since the dielectric breakdown having the TZDB characteristics is not caused in a pattern without the STI edge even by application of the voltage mentioned above.

On this presumption, the STI edge is carefully observed, and it is observed that a portion which forms the edge of the trench is thinner than other portions in the insulating film remaining in the trench.

Thus, a method of forming the trench and the insulating film has been reviewed. In this case, the trench is formed by etching the silicon substrate through STI dry etching, and the insulator buried in the trench is formed by oxidizing the inside of the-trench with water produced from the combustion of hydrogen and oxygen and by a CVD oxide film, after the etching and cleaning processes mentioned above.

On the other hand, Japanese Patent Publication Laid-open No. 2000-269499 (hereinafter referred to as a reference 1) points out that the gate oxide film deposited at a trench upper corner of a P-channel power MOSFET has a thickness smaller than those in flat portions or on a trench sidewall. Furthermore, it is also pointed out that the electric field concentrates on the thin oxide film at the corner portion to cause the dielectric breakdown of the gate insulating film.

In order to prevent such a dielectric breakdown of the gate insulating film, the reference 1 proposes a MOSFET in which the gate insulating film located at the corner portion of the trench has a thickness greater than the thickness of other portions of the trench. The reference 1 also discloses that an impurity concentration in the silicon substrate region adjacent to the corner portion of the trench is locally made higher than the impurity concentration in other portions so as to form the gate insulating film with greater thickness at the corner portion. It points out that if, in this way, RIE (Reactive Ion Etching) is utilized to etch the region containing a high concentration of impurities, and a trench is formed, and then a gate oxide film is formed in the trench by a hydrochloric acid dilution oxidization method, an oxide film having nearly double the thickness is formed in the region containing the high concentration of impurities (paragraph 0031).

Next, Japanese Patent Publication Laid-open No. 6-267938 (hereinafter referred to as a reference 2) describes a method of forming an oxide film wherein 2 to 8 wt % of trans-1,2-dichloroethylene is added in an oxidizing atmosphere, in order to form a silicon oxide film with high quality on the silicon substrate. It is shown that, in accordance with this method, impurities such as heavy metals and alkali ions can be gettered by adding trans-1,2-dichloroethylene.

Furthermore, Japanese Patent Publication Laid-open No. 63-316440 (hereinafter referred to as a reference 3) discloses that when a trench is formed in the silicon substrate by the reactive ion etching, a mixed gas of chlorine and oxygen can be used as an etching gas to prevent a rough bottom, a rough sidewall and the like of the trench that are caused by precipitation of carbon in the etching with a gas containing carbon such as carbon tetrachloride.

Still further, Japanese Patent Publication Laid-open No. 11-274288 (hereinafter referred to as a reference 4) describes that an edge of an active region is rounded (paragraph 0006) so as to prevent the electric field concentration on the corner produced in the active region adjacent to the trench. Further, the reference 4 proposes rounding the corner portion of the active region to eliminate acute angle shaped portions in the active region and an oxide film region adjacent to the trench, as well as performing thermal oxidation to provide climbing to a polycrystal silicon film side. In this case, in the trench and the active region, a silicon oxide film having a protrusion protruding like a bird's beak is formed, and the corner portion of the active region is positioned under the protrusion, and a roundly bored concave portion which retreats inward from the corner portion on an upper side thereof is formed (paragraph 0022). The reference 4 also discloses that dry oxidation at 1100° C. and HCl oxidation at 1000° C. or higher, for example, 1100° C. can be used as a method of forming the silicon oxide film shaped like the bird's beak in the trench and active region (paragraph 0023).

Reviewing further here the references 1 to 4, the reference 1 only discloses a method of manufacturing the P-channel power MOSFET, and does not give any consideration of the MOS transistor having a shallow STI region. That is, the reference 1 makes it clear that in the MOSFET comprising a deep trench, a high concentration impurity region is formed only in the region close to the corner portion of the trench, and then a thick gate oxide film is formed on the high concentration impurity region by the hydrochloric acid dilution oxidization method, thereby enabling the thick oxide film to be formed at the corner portion of the trench. In other words, the reference 1 discloses a method of providing a thick oxide film at the corner portion by the combination of the impurity concentration at the trench corner portion and the hydrochloric acid dilution oxidization method.

As apparent from this, the reference 1 does not at all suggest a method of forming an oxide film having a shallow trench such that a high concentration impurity region can not be formed, and a method of forming a locally thick oxide film without using the region in which the impurity concentration is high.

Furthermore, the reference 2 only discloses the method of forming the oxide film using trans-1,2-dichloroethylene, and does not at all indicate a method of locally thickening only part of the oxide film when a trench is formed. In addition, the reference 2 proposes setting the content of dichloroethylene in the oxidizing atmosphere to 2.0 to 14 wt % to remove a natural oxide film having a thickness of 0.5 to 1.4 nm and to form a silicon oxide film with high quality, but does not give any consideration of the oxide film formed inside the trench.

Still further, the reference 3 discloses a method of forming a trench through etching with chlorine and oxygen gases instead of a gas containing carbon so as to eliminate a disadvantage caused when the trench is formed through etching with the gas containing carbon. During this etching, a deposit containing silicon dioxide as a main component is deposited on the trench sidewall, and this deposit is removed by fluorine (page 3, upper right column and lower right column). However, the reference 3 does not refer to a treatment after the trench is formed with chlorine and oxygen gases and the deposit is removed. Especially, the reference 3 proposes formation of the oxide film with chlorine and oxygen gases instead of the gas containing carbon, and does not at all disclose a solution when carbon is contained as in dichloroethylene (DCE), for example.

Next, the reference 4 proposes rounding the corner portion at an upper position in the element region by oxidation, and embedding into the trench a silicon oxide film protruding further than an element region surface by the thermal oxidation. However, the reference 4 does not indicate a method of forming an oxide film having locally different thickness in a single oxide film formation, and a change in the thickness of the oxide film inside the STI region, and it does not at all describe conditions required for the oxide film formation, such as the concentration of HCl oxidation.

SUMMARY OF THE INVENTION

An object of the present invention is to provide a manufacturing method of a semiconductor device to intentionally form an oxide film having locally different thickness in a single oxidation.

A specific object of the present invention is to provide a manufacturing method of a semiconductor device capable of being applied to a semiconductor device having a configuration with an STI region to discover a cause of deterioration of TZDB characteristics resulting from the existence of the STI region and improve the TZDB characteristics.

Another object of the present invention is to provide a manufacturing method of a semiconductor device comprising the STI region in which a dielectric breakdown does not occur even when an electric field whose intensity is 15 MV/cm or higher is applied to a gate insulating film.

Still another object of the present invention is to provide a manufacturing method of a semiconductor substrate in which when an oxide film is formed on a trench inner wall, an angle of the oxide film at a corner portion of a trench upper part is made gentle, thereby allowing a corner portion of a semiconductor region to be round.

One aspect of the present invention can provide a manufacturing method of a semiconductor device having an STI region in which a trench is formed in a semiconductor region by etching and an insulator is filled into the trench, and the method comprises the steps of: preparing dichloroethylene (DCE); and subjecting an inside of the trench to halogen oxidation with the dichloroethylene, whereby an angle of a corner portion of the semiconductor region adjacent to an opening upper end portion of the trench is made rounder than the angle before the halogen oxidation.

Another aspect of the present invention can provide the manufacturing method of the semiconductor device, wherein an insulating film, which gradually becomes thinner from the opening upper end portion of the trench to a bottom portion of the trench, is formed in the trench by the halogen oxidation with the dichloroethylene.

Still another aspect of the present invention can provide the manufacturing method of the semiconductor device, wherein a concentration of the dichloroethylene in an oxygen environment is within a range of 0.45% to 1.97% by weight.

Another aspect of the present invention can provide the manufacturing method of the semiconductor device which comprises the step of: filling the insulator into the trench after the halogen oxidation.

Still another aspect of the present invention can provide an oxidation method of a semiconductor substrate having an STI region in which a trench is formed in a semiconductor region by etching and an insulator is filled into the trench, and the method comprises the steps of: preparing dichloroethylene (DCE); and subjecting an inside of the trench to halogen oxidation with the dichloroethylene, whereby a thickness of an oxide film at a corner portion of the semiconductor region adjacent to an opening upper end portion (i.e., opening edge) of the trench is made greater than a thickness of the other oxide film in the trench.

Yet another aspect of the present invention can provide the oxidation method of the semiconductor substrate which comprises the step of: using nitrogen as a carrier gas, bubbling with the nitrogen to vaporize the dichloroethylene, and introducing, together with oxygen, the dichloroethylene into a furnace containing a semiconductor substrate in which the trench is formed, wherein a content of the dichloroethylene in an oxygen environment in the furnace is decided by a weight percent between a weight of oxygen introduced into the furnace and a weight of the DCE introduced into the furnace by the bubbling. In this case, the weight percent indicating a proportion of the weight of the oxygen to the weight of the DCE is preferably within a range of 0.45% to 1.97%.

DESCRIPTION OF THE PREFERRED EMBODIMENT

Figure 1:
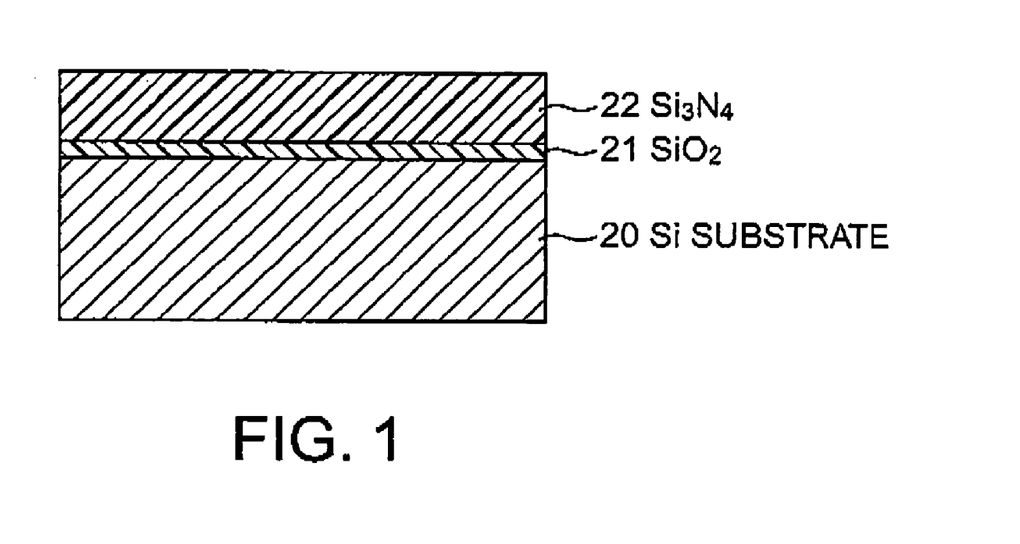
FIG. 1 is a sectional view used for explaining a manufacturing method of a semiconductor device according to one embodiment of the present invention, showing here one step of a manufacturing process.

Referring to FIG. 1 to FIG. 7, a manufacturing method of a semiconductor device according to one embodiment of the present invention will be described in the order of step. Manufacture of a DRAM as the semiconductor device will be described here as an example. Referring to FIG. 1, a silicon oxide film 21 and a silicon nitride film 22 are sequentially formed on a silicon substrate 20 by an ordinary technique.

Figure 2:
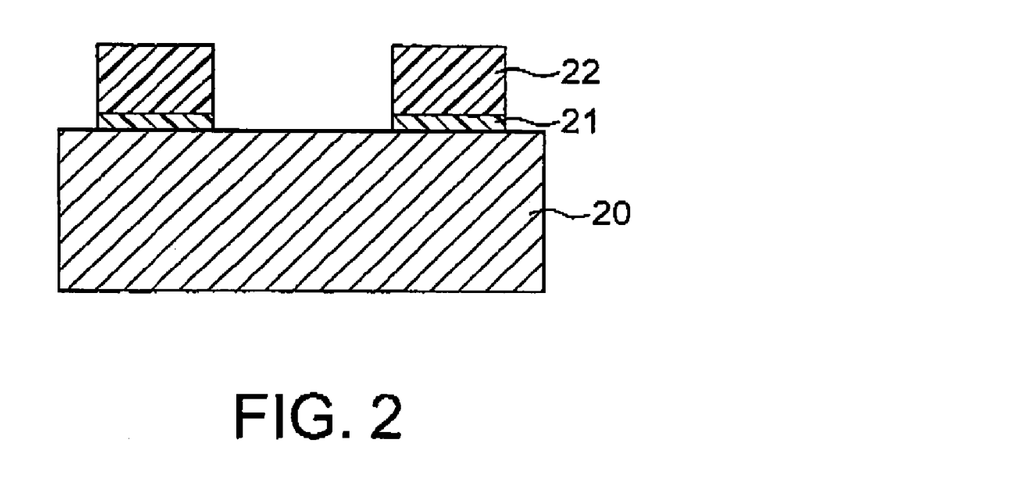
FIG. 2 is a sectional view for explaining a step following FIG. 1.

Next, as shown in FIG. 2, the silicon nitride film 22 and silicon oxide film 21 are selectively etched by use of a photolithography technique and a dry etching technique after a region in which a trench is to be formed is covered with a mask (not shown), and only the silicon nitride film 22 and silicon oxide film 21 in an element region are left on the silicon substrate 20, and the surface of the silicon substrate 20 is separate into the element region and a region for trench formation.

Figure 3:
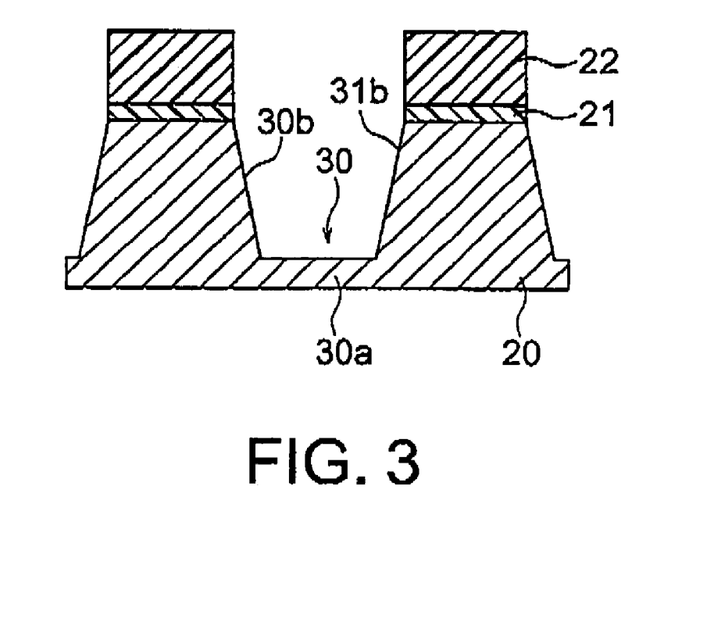
FIG. 3 is a sectional view for explaining a trench producing step implemented after the step of FIG. 2.

In this state, as shown in FIG. 3, with the silicon oxide film 21 and silicon nitride film 22 on the surface of the silicon substrate 20 as a mask, the silicon substrate 20 is etched, for example, to a depth of 250 nm, for example, by dry etching, and a trench 30 is formed in a trench forming region, followed by cleaning. As shown, the trench 30 has a bottom portion 30a and sidewall portions 30b between which the bottom portion is interposed.

Figure 4:
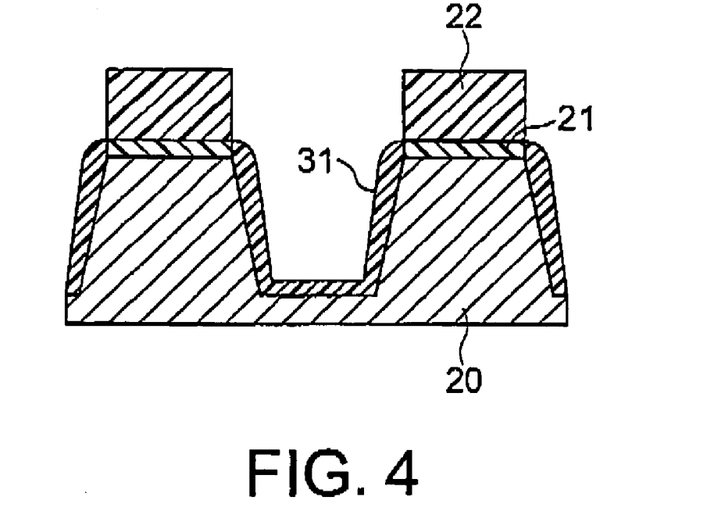
FIG. 4 is a sectional view for explaining a step of forming a silicon oxide film inside a trench produced in the step of FIG. 3.

Subsequently, as shown in FIG. 4, a silicon oxide film 31 is formed on the bottom portion 30a and sidewall portions 30b of the trench 30 by an oxide film formation method according to the present invention. The oxide film formation method according to the present invention will be described later.

Figure 5:
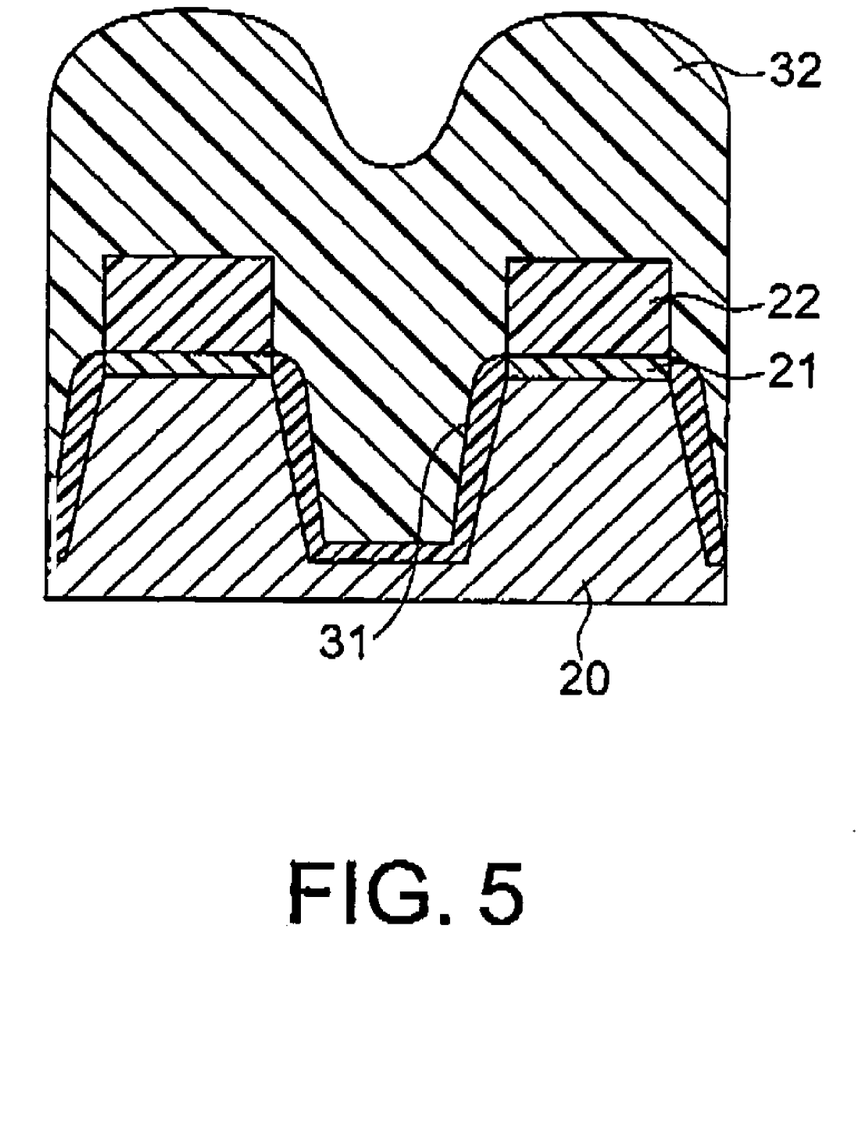
FIG. 5 is a sectional view for explaining a step implemented after the step of FIG. 4.
Figure 6:
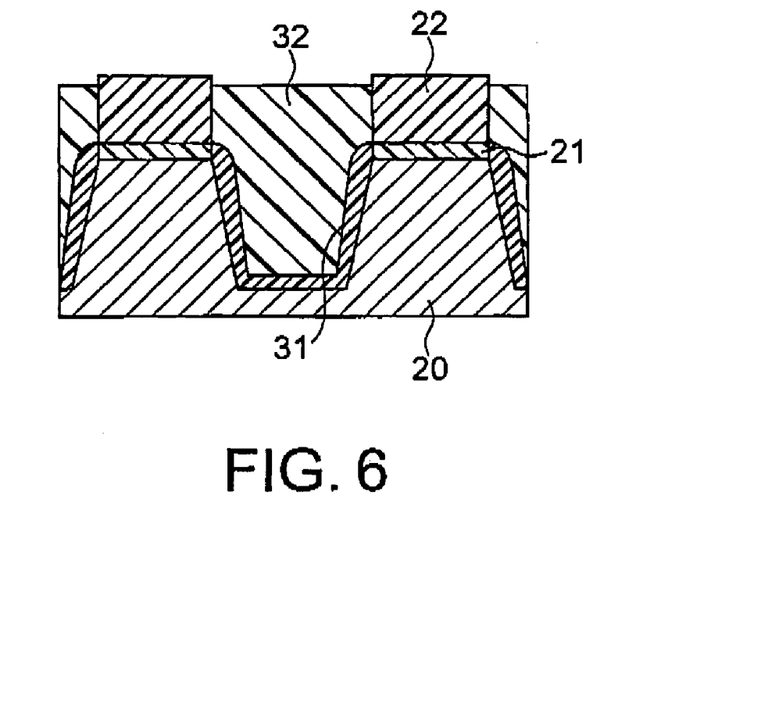
FIG. 6 is a sectional view for explaining a step implemented after the step of FIG. 5.
Figure 7:
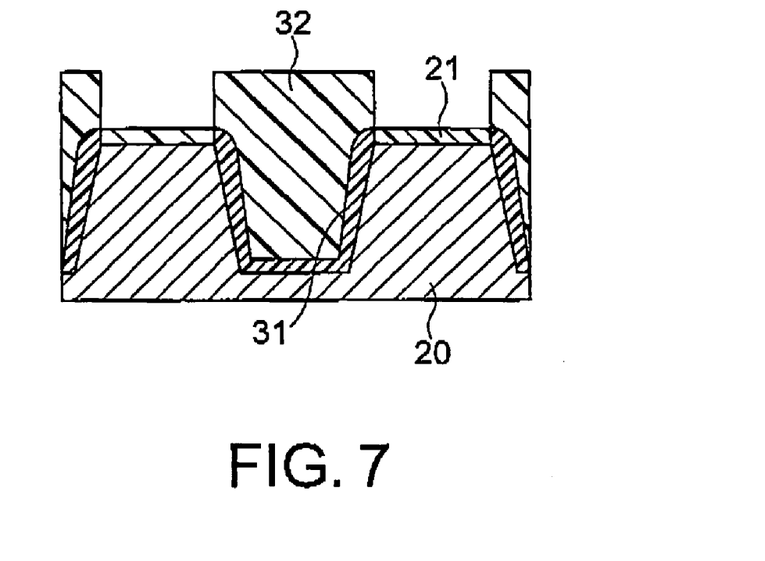
FIG. 7 is a sectional view for explaining a step implemented after the step of FIG. 6.

Subsequently, as shown in FIG. 5, a silicon oxide film (plasma oxide film) 32 having a thickness of, for example, 800 nm is formed on entire surfaces of the exposed silicon oxide film 31 and the silicon nitride film 22 by CVD. Then, as shown in FIG. 6, the plasma oxide film 32 is polished by chemical mechanical polishing (CMP) until the silicon nitride film 22 is exposed. Next, as shown in FIG. 7, the silicon nitride film 22 is removed. The plasma oxide film 32 and the silicon oxide film 31 form an STI region, thereby forming an element insulating region.

Subsequently, in accordance with the ordinary technique, the silicon oxide film 21 on the element region is removed, so as to form a gate insulating film, a source region, a drain region and the like in the element region and form gate electrodes, word lines, capacitors and the like, thereby forming the DRAM.

Figure 8:
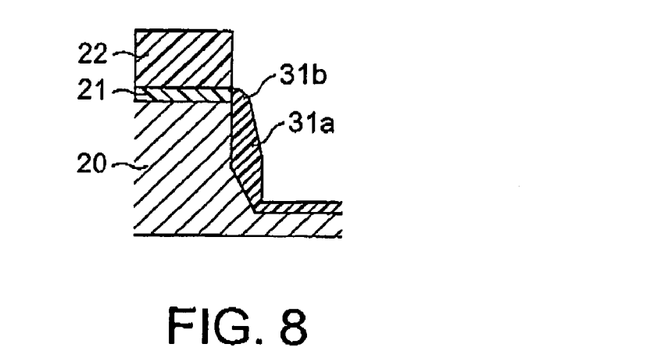
FIG. 8 is a view for explaining an oxide film formed by a conventional oxidation method.

A conventional oxidation method as used in a step shown in FIG. 4 will be described here. When, for example, an oxidation method utilizing water produced from the combustion of hydrogen and oxygen is used as the conventional oxidation method, a silicon oxide film 31a is formed in a wet atmosphere as shown in FIG. 8. It has been found that the silicon oxide film 31a formed in the wet atmosphere has a greater thickness at a central portion of the sidewall portion 30b of the trench 30 and a smaller thickness at an upper corner portion 31b located at an upper edge of the sidewall portion 30b of the trench 30. In other words, the silicon oxide film 31a has an angle almost perpendicular to a surface of the silicon substrate 20 at the upper corner portion 31b located at the upper edge of the trench 30. If stress of the silicon oxide film 31a having such a shape is measured, it is revealed that the stress at the upper corner portion 31b is high.

Furthermore, as shown in FIG. 8, with the silicon oxide film 31a having an almost perpendicular angle formed, a transistor having a gate oxide film 6 nm thick is produced through steps similar to those shown in FIG. 5 to FIG. 7. If TZDB characteristics of the transistor thus produced are measured, a dielectric breakdown starts to be caused by a voltage of 8 V or less (i.e., an electric field intensity of 13.3 MV/cm). This is presumably due to the fact that as the stress at the upper corner portion 31b of the silicon oxide film 31a (FIG. 8) increases, the gate oxide film to be formed after that can not be uniformly formed, resulting in an increase in a defective fraction.

On the other hand, in the case of a pattern without an edge in the STI region, because the dielectric breakdown occurs when a voltage of 9 V or higher is applied to the gate oxide film having a thickness of 6 nm, that is, when an electric field whose intensity is 15 MV/cm is applied, the present invention is intended to produce a DRAM capable of achieving the TZDB characteristics which are about the same as those of the pattern without the edge in the STI region. First, various kinds of oxidation methods are tried on the assumption that a drop in an insulation voltage is caused by heavy metal contamination at the corner portion of the STI region. As a result, improvement of characteristics has been achieved most in the oxidation of an inner wall of the trench 30 by halogen oxidation with dichloroethylene (DCE). However, when the heavy metal contamination is evaluated, it has been found that the heavy metal contamination has already reached a low level at a stage prior to the halogen oxidation, and heavy metals are actually not removed in the halogen oxidation. In other words, this means that the above improvement of characteristics is not attributed to heavy metal removal effects of the halogen oxidation but to other effects of the halogen oxidation.

In this respect, a further examination has proved that when the halogen oxidation with DCE is applied to the inner wall of the trench 30, the silicon oxide film 31 formed on the inner wall of the trench 30 by the halogen oxidation has a cross section schematically shown in FIG. 4 to FIG. 7, which is obviously different from that of the silicon oxide film 31a shown in FIG. 8.

Figure 9:
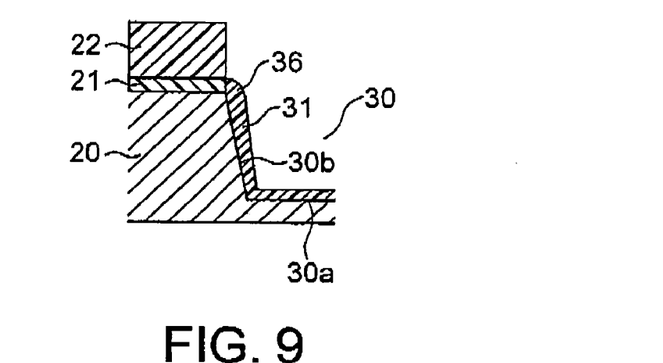
FIG. 9 is a view for explaining the oxide film formed by an oxidation method of the present invention.

Furthermore, to concretely explain the cross section of the silicon oxide film 31 using FIG. 9, it has been found out that the silicon oxide film 31 formed by the halogen oxidation with dichloroethylene (DCE) is thick at an upper corner portion 36 of the sidewall portion 30b of the trench 30, and becomes thinner as it approaches the bottom portion 30a of the trench 30. It has become evident that when the silicon oxide film 31 with such a structure is formed, an edge portion of the silicon substrate 20 corresponding to the upper corner portion 36 of the silicon oxide film 31 has an angle (obtuse angle) greater than 90° with respect to the surface thereof, resulting in a round angle at the edge portion of the silicon substrate 20. That is, it has been revealed that if the halogen oxidation is carried out, the silicon oxide film 31 can be locally thick at the upper corner portion 36 of the trench 30. For example, it has been confirmed that the angle of the silicon substrate 20 at the corner portion (edge portion) of the semiconductor substrate 20 is within a range of 95° to 98°, which is rounder than the angle before the halogen oxidation.

Furthermore, the silicon oxide film 31 comprising the cross sectional shape mentioned above has a lower stress also at the upper corner portion 36 of the trench 30 than that of the silicon oxide film 31a (FIG. 8) produced from the combustion of hydrogen and oxygen.

In accordance with the results of the experiment, it is presumed that the dielectric breakdown characteristics of the silicon oxide film at the corner portion of the STI region deteriorate at the portion where the stress of the silicon oxide film 31 is locally high. The present invention is based on the findings that it is possible to form the silicon oxide film 31 having a low stress and having a shape that can reduce the stress when the halogen oxidation is applied. As a result, when gate oxidation is performed, the gate oxide film can be formed which is uniform up to the corner portion of the STI region and is free from defects.

Figure 10:
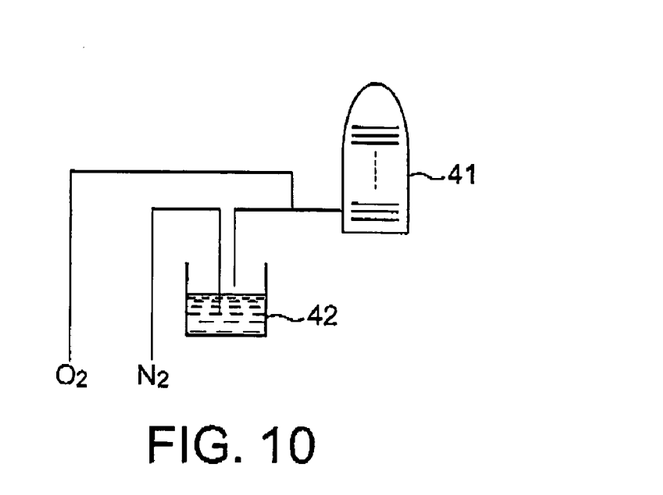
FIG. 10 is a schematic configuration view for explaining a system used for the manufacturing method of a semiconductor device according to one embodiment of the present invention.

Referring to FIG. 10, a system used for the manufacturing method according to one embodiment of the present invention is shown. As shown, the system comprises a reaction furnace 41 and a bubbler 42, and liquid dichloroethylene (DCE) ($C_2H_2Cl_2$) is filled into the bubbler 42. The bubbler 42 is installed in a constant temperature bath which is not actually shown, and while nitrogen gas ($N_2$) is supplied as a carrier gas into the bubbler 42, a plurality of silicon substrates are inserted in the reaction furnace 41. The plurality of silicon substrates is arranged horizontally and in parallel in the shown reaction furnace 41.

Into the reaction furnace 41, oxygen gas ($O_2$) is introduced and DCE vaporized by bubbling with the carrier gas is supplied from the bubbler 42. In the example shown, oxygen gas and vaporized DCE are mixed immediately before the reaction furnace 41 and introduced into the reaction furnace 41.

Next, the halogen oxidation to be conducted in the reaction furnace 41 in the example shown will be described. As apparent from FIG. 10, into the reaction furnace 41, oxygen is directly introduced and DCE vaporized by bubbling with nitrogen in the bubbler 42 is introduced. In this state, the following reaction is caused in the reaction furnace 41.

$$3C_2H_2Cl_2+(13/2)O_2=4HCl+6CO_2+H_2O+Cl_2$$

In this reaction, silicon is oxidized by oxidizing species ($H_2O$) on a right side. The present invention has confirmed that the halogen oxidation indicated by the above equation can be applied to the oxidation of the inner wall of the trench 30 to form the silicon oxide film which has a low stress and is locally thick at the corner portion 36 of the trench 30. The halogen oxidation in one embodiment of the present invention will here be described in greater detail. First, the inside of the reaction furnace 41 is heated to a temperature ranging from 850° C. to 950° C., and oxygen and DCE vaporized by the bubbler 42 are introduced into the heated reaction furnace 41. As apparent from the above equation, the halogen oxidation is conducted by the reaction with DCE in the presence of oxygen in the reaction furnace 41.

Next, conditions for the halogen oxidation required to obtain the silicon oxide film 31 having the characteristics and shape mentioned above will be described. The silicon oxide film formed by the halogen oxidation changes depending on the DCE concentration in an oxygen environment. In the experiment by the present inventors, weight percent of DCE, which is obtained by the weight of oxygen introduced into the reaction furnace 41 and the weight of DCE introduced into the reaction furnace 41 by bubbling, is used as a control factor. In the experiment, the weight of oxygen is 28.57 g when the flow rate of oxygen is 20 slm, and 433 mg of DCE is introduced into the reaction furnace 41 when nitrogen for bubbling runs at a flow rate of 200 sccm, thus allowing the silicon oxide film having the preferable characteristics and shape to be obtained. The weight percent of DCE in this case is 0.443128.57 (=0.015), resulting in 1.5%. In addition, if a relationship between nitrogen for bubbling and oxygen on the conditions described above is expressed by flow percent, it will be 0.2/20 (=0.01), resulting in 1%.

Furthermore, the flow rates of oxygen and nitrogen are changed to examine the relationship between the weight percent of the DCE concentration and the defective fraction (%) and the relationship between the weight percent of the DCE concentration and the stress (MPa) at the upper corner portion, thereby finding a proper range of the DCE concentration.

Figure 11:
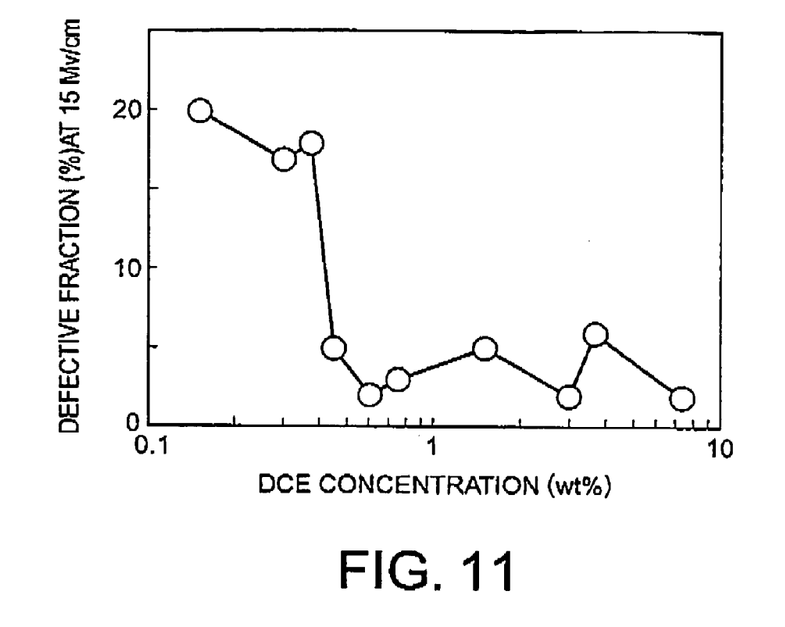
FIG. 11 is a graph for explaining effects by the oxidation method according to the present invention, showing here a relationship between a DCE concentration (wt %) and a defective fraction (%)

Referring to FIG. 11, the relationship between the DCE concentration (wt %) and the defective fraction (%) when the TZDB is caused at 15 MV/cm is shown. As apparent from the graph, when the DCE concentration is within a range of 0.15 to 0.375% by weight, a high defective fraction of 20 to 18% is shown, while the defective fraction is 5% or lower when the DCE concentration is 0.45%. This shows that the DCE concentration should be 0.45% or greater by weight.

Figure 12:
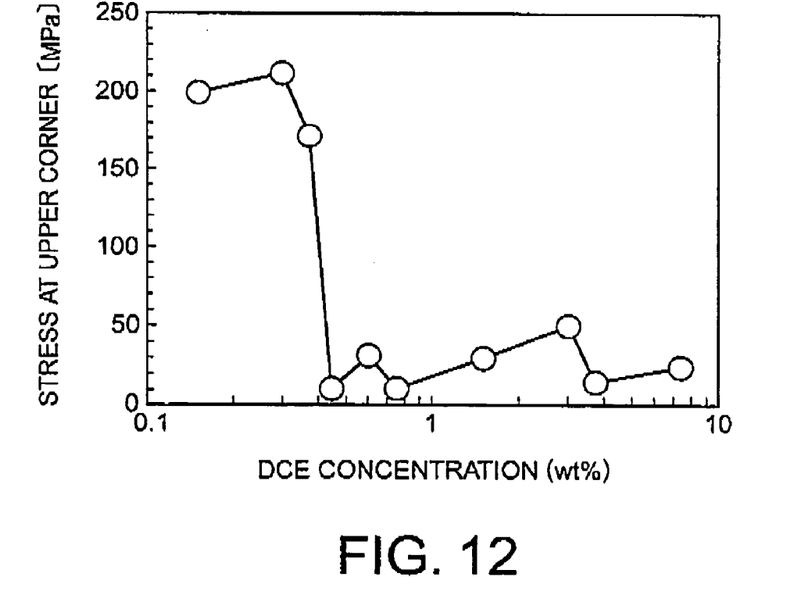
FIG. 12 is another graph for explaining effects by the oxidation method according to the present invention, showing here a relationship between the DCE concentration (weight percent) and stress.

On the other hand, referring to FIG. 12, the relationship between the DCE concentration (weight percent) and the stress at the upper corner portion is shown, and it is apparent that when the DCE concentration is 0.375% or lower by weight, a significantly high stress of 150 MPa or higher is shown, but beyond 0.375%, the stress is sharply reduced to 50 MPa or lower. It is also understood from these graphs that the DCE concentration should be 0.45% or greater by weight.

On the other hand, in consideration of the characteristics of field effect transistors configuring the DRAM, it is required not to cause a hump in characteristics that represent the relationship between a gate threshold voltage (Vth) and a drain current (Id) in order to attain favorable transistor characteristics. The hump can be evaluated by the threshold voltage. In this case, a transistor having a threshold voltage of 2 V or higher can be referred to as a favorable transistor.

Figure 13:
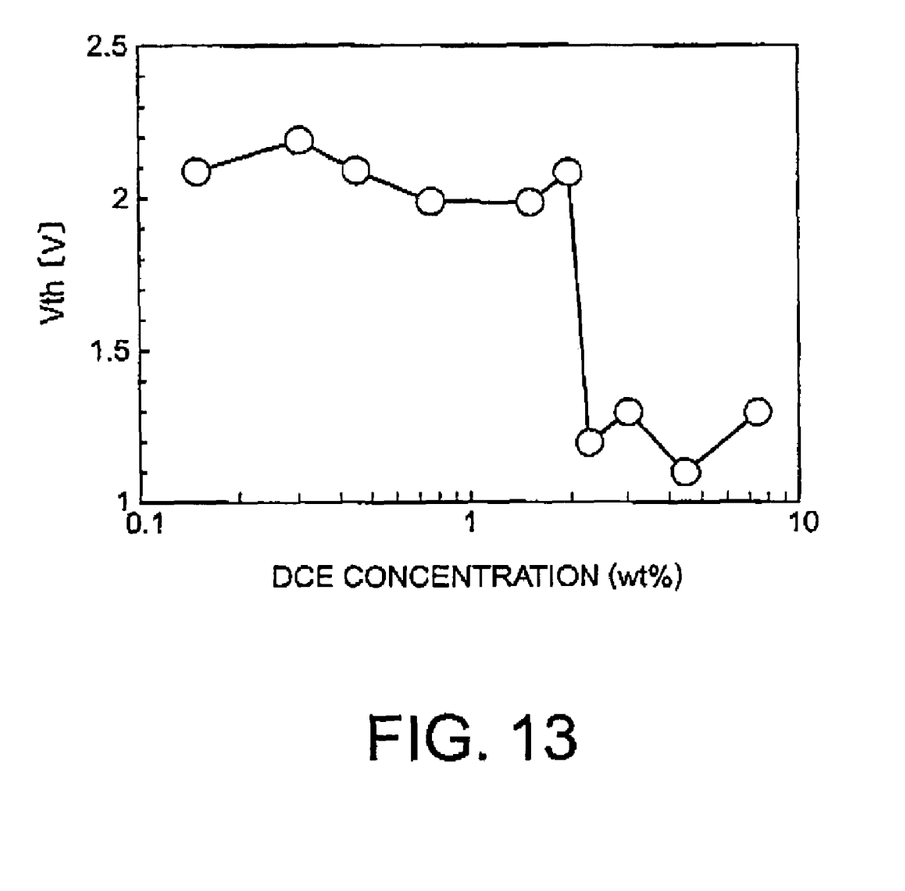
FIG. 13 is a graph for explaining the effects by the oxidation method according to the present invention, showing here a relationship between a threshold voltage (Vth) and the DCE concentration (weight percent).

Referring to FIG. 13, the relationship between the threshold voltage (Vth) and the DCE concentration (weight percent) is shown. As apparent from the graph, when the DCE concentration exceeds 1.97 wt %, the threshold voltage (Vth) rapidly drops to lower than 1.5 V. As a result, the DCE concentration preferably should not, exceed 1.97 wt %. In other words, this means that when the DCE concentration exceeds 1.97 wt %, the hump emerges. This conceivably results from the fact that if the DCE concentration increases to higher than 1.97 wt %, chlorine remains in the oxide film on the STI inner wall and this chlorine acts as electric charges.

As apparent from FIGS. 11 to 13, it is understood that the silicon oxide film according to the present invention comprising desired characteristics and shape can be obtained when the DCE concentration is within a range of 0.45% to 1.97% by weight. That is, in the silicon oxide film formed with the DCE concentration reduced to lower than 0.45% by weight, the defective fraction exceeds 10% if the TZDB characteristics are measured at 15 MV/cm, and the stress at the upper corner portion is 100 MPa or higher, leading to a high defective fraction of the DRAM using the silicon oxide film. On the other hand, it is confirmed that if the DCE concentration exceeds 1.97% by weight, a transistor having a desired threshold voltage can not be obtained.

The above embodiment has been described in connection with the case where the present invention is applied to the formation of the silicon oxide film, but the present invention is not at all limited to this and can be applied to the formation of an oxide film on the inner wall of the trench formed in other semiconductor materials, and can also be applied to the manufacture of a semiconductor device other than the DRAM.

According to the present invention, the oxide film is formed by the halogen oxidation in the oxygen environment where the DCE concentration is properly selected, thereby making it possible to form an oxide film having a low stress at the corner portion of the trench inner wall and having a greater thickness at the corner portion than the thickness at other portions. When such an oxide film is formed, it is possible to improve the TZDB characteristics of the semiconductor device and decrease the defective fraction of the semiconductor device.

What is claimed is:

1. An oxidation method of a semiconductor substrate having an STI region, comprising the steps of:
   etching a semiconductor region to form a trench;
   preparing dichloroethylene (DCE); and
   subjecting an exposed inside upper end portion of the trench to halogen oxidation with the dichloroethylene and oxygen, whereby a thickness of an oxide film at a corner portion of the semiconductor region adjacent to said upper end portion of the trench is greater than a thickness of said oxide film at other portions of the trench, the halogen oxidation being carried out at a temperature between 850 and 950° C. in an atmosphere within a furnace, by controlling a concentration of the DCE within a range between 0.45 and 1.97% by weight, to thereby render a stress imposed on the upper corner portion of the trench to less than 100 MPa.

2. An oxidation method of oxidizing an inner wall of a trench formed in a semiconductor region of a semiconductor substrate, the method comprising the steps of:
   preparing dichloroethylene (DCE); and
   carrying out halogen oxidation of an exposed inner wall of the trench using the DCE and oxygen,
   the halogen oxidation being carried out at a temperature between 850 and 950° C. in an atmosphere within a furnace, by controlling a concentration of the DCE within a range between 0.45 and 1.97% by weight, to thereby render a stress imposed on the upper corner portion of the trench to less than 100 MPa.

3. The oxidation method as claimed in claim 2, wherein the halogen oxidation is carried out by bubbling the DCE with nitrogen to vaporize the DCE to be introduced into the furnace together with the oxygen and by controlling a content of the DCE introduced into the furnace;
   the content of the DCE in the furnace being determined by the oxygen introduced into the furnace and the nitrogen used for bubbling the DCE by controlling a flow rate of the nitrogen to a flow rate of the oxygen to 0.01.

4. The oxidation method of the semiconductor substrate according to claim 1, comprising the step of: using nitrogen as a carrier gas, bubbling with the nitrogen to vaporize the dichloroethylene, and introducing, together with oxygen, the dichloroethylene into a furnace containing a semiconductor substrate in which the trench is formed.

* * * * *